United States Patent [19]

Benzing et al.

[11] Patent Number: 5,972,558
[45] Date of Patent: Oct. 26, 1999

[54] METHOD FOR PRODUCING A POSITIVE AS WELL AS A NEGATIVE MULTICOLOR COLOR-PROOF IMAGE

[75] Inventors: Martin Benzing, Biebelnheim; Jürgen Mertes, Gau-Algesheim; Dieter Mohr, Appenheim; Holger Schembs, Mainz, all of Germany

[73] Assignee: Agfa-Gevaert, Mortsel, Belgium

[21] Appl. No.: 09/104,365

[22] Filed: Jun. 25, 1998

[30] Foreign Application Priority Data

Jun. 26, 1997 [EP] European Pat. Off. .............. 97201951

[51] Int. Cl.⁶ ............................ G03C 1/805; G03C 11/12
[52] U.S. Cl. ............................................ 430/257; 430/253
[58] Field of Search ..................................... 430/253, 257

[56] References Cited

U.S. PATENT DOCUMENTS

| 4,489,154 | 12/1984 | Taylor, Jr. | 430/253 |
| 4,923,780 | 5/1990 | Taylor, Jr. | 430/257 |
| 4,987,051 | 1/1991 | Taylor, Jr. | 430/253 |
| 5,545,506 | 8/1996 | Wilczak et al. | 430/253 |

FOREIGN PATENT DOCUMENTS

| 0 325 150 | 7/1989 | European Pat. Off. . |
| 0 503 402 | 9/1992 | European Pat. Off. . |
| 0 514 186 | 11/1992 | European Pat. Off. . |
| WO 95/03424 | 2/1995 | WIPO . |

*Primary Examiner*—Janet Baxter
*Assistant Examiner*—Yvette M. Clarke
*Attorney, Agent, or Firm*—Foley & Lardner

[57] ABSTRACT

A method for producing a positive as well as a negative multicolor color-proof image.

The invention relates to a color proofing process in which a multicolor image is produced from a plurality of single-color images in register with the aid of a colored, photosensitive, photopolymerizable material on an image-receiving material. Depending on the processing variant, both positive and negative film masters can be processed, even simultaneously on a single receiving material, and it is not necessary for the emission spectrum of the light source to be variable.

6 Claims, No Drawings

METHOD FOR PRODUCING A POSITIVE AS WELL AS A NEGATIVE MULTICOLOR COLOR-PROOF IMAGE

FIELD OF THE INVENTION

1. Technical Field of the Invention

The invention relates to a colour proofing process in which, with the aid of a coloured, photosensitive, photopolymerizable material on an image-receiving material, a multicolour image comprising a plurality of single-colour images in register is produced.

2. Prior art

Peel-apart processes described hitherto which utilise only a single light source generally produce either a positive or negative proof.

A system in which both a positive and a negative proof can be produced, even on the same receiving material is disclosed in U.S. Pat. No. 4,923,780, where solubility differentiation, before development by peeling off the film support, is achieved with the aid of actinic light of different wavelengths in two successive exposures.

EP-A 0 514 186 discloses a process in which a material consisting of a release-coated, transparent film support, a coloured, photosensitive layer applied thereto and a thermoplastic adhesive layer located thereon is used to produce a colour proof in a similar manner to the present invention. The material is laminated, by means of its adhesive layer, onto an image-receiving material and exposed under a negative colour separation, and the film support is then peeled off without producing imagewise differentiation. Another transparent film support, but with a coating of adhesion promoter, is then laminated on, the entire image is flood-exposed, and the non-image areas are removed by peeling-off the film support. All the steps are then repeated using materials in the other primary colours. However, the production of images from positive colour separations is not described. Further disadvantages of this process compared with the novel process are the use of 2 different film supports instead of a single film, and the poorer resolution to be expected for the negative images, since exposure must take place through a film.

The object of the invention was to use a photosensitive material to provide a colour proofing process of the generic type described at the outset which exhibits better resolution than the peel-apart process, in particular when producing negative colour proofs.

DETAILED DESCRIPTION OF THE INVENTION

The novel process uses a light source whose emission spectrum can be modified, and a material consisting of A) a transparent, flexible film support made of plastic,
B) a photopolymerizable layer which comprises
   B1) a polymeric binder,
   B2) a free-radical-polymerizable compound,
   B3) a compound which is capable of initiating the polymerization of B2) on exposure to actinic light, and
   B4) a solid or coloured pigment in a primary colour of multicolour printing, and
C) a thermoplastic adhesive layer on the photosensitive layer, as follows:

Positive and negative colour proofs are produced together on a receiving material by laminating a material coloured in a primary colour onto an image-receiving material, peeling-off the film support, exposing the material under the associated negative colour separation film (with the areas where positive colour proofs are to be formed covered in a light-opaque manner), re-laminating the film support which had earlier been peeled off back onto the material, flood-exposing the part on which the negative colour proofs are to be formed while simultaneously exposing the areas where positive colour proofs are to be formed under the associated positive colour separation film, developing the image by peeling-off the film support from the photopolymerizable layer together with the non-image areas, and repeating the same steps using a material in at least one other primary colour.

Alternatively, the process can be carried by: laminating a material coloured in a primary colour onto an image-receiving material, exposing the material under the associated positive colour separation film (with the areas where negative colour proofs are to be formed covered in a light-opaque manner), developing the positive images by peeling-off the film support from the photopolymerizable layer together with the non-image areas of the positive images, exposing the areas where negative colour proofs are to be formed under the associated negative colour separation film while simultaneously flood-exposing the positive images, re-laminating the film support onto the material, flood-exposing the entire system, developing the negative images by peeling-off the film support from the photopolymerizable layer together with the non-image areas of the negative images, and repeating the same steps using a material in at least one other primary colour.

Negative colour proofs are produced by laminating a material coloured in a primary colour onto an image-receiving material, peeling-off the film support, exposing the material under the associated negative colour separation film, re-laminating the film support which had previously been peeled off back onto the material, flood-exposing the entire image, developing the image by peeling-off the film support from the photopolymerizable layer together with the non-image areas, and repeating the same steps using a material in at least one other primary colour.

Positive colour proofs are produced by laminating a material coloured in a primary colour onto an image-receiving material, exposing the material under the associated positive colour separation film, developing the image by peeling-off the film support from the photopolymerizable layer together with the non-image areas, and repeating the same steps using a material in at least one other primary colour.

Since, in the novel process for the production of negative colour proofs, the colour separation films come into direct contact with the photopolymerizable layer, radiation cannot leak beneath the films, giving much better resolution of the negative colour proofs compared with other peel-apart processes.

A material which can be used for this purpose, corresponding to the above description, is disclosed in U.S. Pat. Nos. 4,895,787, 5,049,476 and EP Application No. 96 201 083.1.

The adhesive layer of the material to be employed can contain a colourless, transparent or white pigment which has a particle size in a certain range and is present in such an amount within a certain range that it is not visible in a transparent polymer layer.

The pigment can be of an inorganic or organic nature and must be insoluble in the coating solvent used for the adhesive layer. Since the solvent employed is preferably water or a mixture consisting predominantly of water, a multiplicity of water-insoluble substances are suitable as pigments. Examples are silicic acids, aluminium oxides, silicates, phosphates, borates and other inorganic salts or oxides. Also suitable are organic polymers, such as polyethylene, polypropylene, polyester, polycarbonates, phenolic resins and other water-insoluble substances. In general, inorganic pigments are preferred.

The pigments should be readily dispersible in the usually aqueous solutions employed for the coating. Silicic acid pigments have proven particularly successful for this purpose.

The adhesive layer is applied directly to the photopolymerizable layer from a solvent or solvent mixture which does not dissolve the latter, and is dried. Suitable solvents which do not dissolve the coloured layer are water or a mixture predominantly consisting of water, and saturated hydrocarbons. Many polymers can be applied from aqueous dispersion; however, application from solution is preferred. Suitable for this purpose are, for example, salts of polymers containing acid groups, for example carboxyl groups. A preferred example is an aqueous-alkaline solution of a vinyl acetate-crotonic acid copolymer (®Mowilith Ct5). Other suitable polymers are polyvinyl acetate or polyacrylate dispersions. The polymer should have a softening point in the range from 40 to 200° C., preferably from 60 to 120° C., and should preferably have a $T_g$ value in the range from 20 to 60° C. In addition to the thermoplastic polymer, the adhesive layer may also contain plasticizers, residue solvents, surface levellers, lubricants, antistatics, optical brighteners and/or UV absorbers. Its layer weight in the dry state is normally from 1 to 30 g/m$^2$, preferably from 3 to 15 g/m$^2$. Suitable adhesive layers are also described in U.S. Pat. No. 4,895,787 and EP-A 525 624.

The photopolymerizable layer of this suitable material comprises, as essential constituents, a polymeric binder, a free-radical-polymerizable compound, a photoinitiator and a dye or coloured pigment in a primary colour of multicolour printing. Examples of photopolymerizable layers having this general composition are described in U.S. Pat. No. 4,895,787, which is expressly incorporated herein by way of reference.

Suitable photoinitiators are a wide variety of compounds or compound combinations which are known for this purpose. Examples are benzoin ethers, benzil ketals, polycyclic quinones, benzophenone derivatives, triarylimidazolyl dimers, photosensitive trihalomethyl compounds, for example trichloromethyl-s-triazines. Preference is given to 2,3-bisarylquinoxalines, as described in U.S. Pat. No. 3,765,898, and 2-aryl-4,6-bistrichloromethyl-s-triazines. The amount of photoinitiator or photoinitiator combination is generally between 1 and 25% by weight, preferably between 5 and 15% by weight.

The polymeric binder is intended to give the layer homogeneity and strength. Suitable binders are styrene-maleic anhydride and styrene-maleic monoester copolymers, acrylate polymers and copolymers, polyamides, polyvinylpyrrolidones, cellulose derivatives, such as cellulose esters and ethers, phenolic resins, polyvinyl esters, polyvinyl acetals, for example polyvinylbutyral, -propional or -formal. The proportion of binder is generally from 15 to 70% by weight, preferably from 20 to 50% by weight, based on the weight of the solid layer.

The polymerizable compound contains at least one, preferably at least two, terminal free-radical-polymerizable double bonds and is not gaseous at atmospheric pressure and temperatures below 100° C. Preference is given to esters and amides of acrylic and methacrylic acids. Esters with polyhydric alcohols are particularly advantageous. Examples are di-, tri-, tetra- and polyethylene glycol di(meth)acrylate, the di(meth)acrylates of oligo- and polypropylene glycols, 1,4-butanediol di(meth)acrylate, trimethylolpropane and trimethylolethane di- and tri(meth)acrylate, pentaerythritol tri- and tetraacrylate or -methacrylate, dipentaerythritol tetra-, penta- and hexa(meth)acrylate. The proportion of polymerizable compound is generally from 15 to 70% by weight, preferably from 20 to 60% by weight.

In the preferred use of the material for colour proofing in multicolour printing, the dyes or coloured pigments are selected so that they conform to the primary colours of multicolour printing, namely cyan, magenta, yellow and black. Pigments are generally preferred. Examples are Permanent Yellow G (C.I. 21 095), Permanent Yellow GR (C.I. 21 100), Permanent Yellow DHG (C.I. 21 090), Permanent Ruby L6B (C.I. 15 850:1), Permanent Pink F3B (C.I. 12 433), ®Hostaperm Pink E (C.I. 73 915), ®Hostaperm Red-Violet ER (C.I. 46 500), Permanent Carmine FBB (C.I. 12 485), ®Hostaperm Blue B2G (C.I. 74 160), ®Hostaperm Blue A2R (C.I. 74 160) and ®Printex 25 (carbon black). The pigments can, if desired, be blended in order to achieve the desired hue. The inorganic or organic pigments are generally dispersed or suspended in a suitable solvent together with some of the binder. The mean particle size is generally below 1 μm.

The proportion of dye or pigment is generally from 8 to 40% by weight, preferably from 12 to 30% by weight.

The photopolymerizable layer can, if desired, contain further constituents, such as hydrogen donors, polymerization inhibitors, plasticizers, residue solvents, surfactants, surface levellers, lubricants, antistatics, inert fillers, optical brighteners and/or UV absorbers. It generally has a layer weight of from 0.2 to 5 g/m$^2$, preferably from 0.3 to 3 g/m$^2$.

Suitable film supports are transparent, flexible, dimensionally stable films made from plastics, for example polyesters, polycarbonates, etc. Particular preference is given to polyester films, in particular biaxially stretched and heat-set films, for example made from polyethylene terephthalate. These should remain dimensionally stable at the requisite lamination temperatures, i.e. of from about 60 to 150° C. Their thickness is generally from 10 to 200 μm, preferably from 25 to 80 μm. The film support is advantageously pretreated on one or both sides with an adhesion promoter and can have a smooth or rough or matt surface, preferably a smooth surface.

In order to carry out the novel process, the photosensitive material described above is laminated, by means of the adhesive layer, onto an image-receiving material. This can consist of plastic, plastic-coated special paper or normal printing paper. Other white or, if desired, non-white receiving materials can likewise be used. A printing paper which is dimensionally stable under lamination conditions is usually preferred, since it gives rise to a visual impression which comes very close to the later print. The lamination is advantageously carried out under pressure and at elevated temperature in a device provided for this purpose. The lamination temperature is usually in the range from 60 to 150° C., preferably between 80 and 130° C.

The finished multicolour image has a glossy surface. If desired, the surface can also be rendered matt by, for example, laminating a film having a rough surface onto the glossy layer surface and peeling it off again. The surface of the finished proof can be protected against scratching or adhesion at elevated temperatures by means of a protective layer.

The invention is illustrated in greater detail by means of the examples below without being restricted thereto. Unless otherwise stated, all percentages and mixing ratios are by weight.

EXAMPLES

Example 1

The following solutions were applied to biaxially stretched and heat-set polyester films (®Melinex 505) with a thickness of 50 μm which have been pretreated with an adhesion promoter on both sides:

|  | Cyan | Magenta | Yellow | Black |
|---|---|---|---|---|
| Dipentaerythritol pentaacrylate | 19.9 | 25.0 | 21.6 | 19.9 |
| 2,4-Bistrichloromethyl-6-biphenylyl-s-triazine | 5.1 | 6.1 | 5.4 | 5.3 |
| Polyvinyl formal (® Formvar 12/85) | 16.3 | 23.0 | 18.4 | 14.2 |
| Copolymer of a polyether-modified polysiloxane containing 80% by weight of ethylene oxide units and 20% by weight of propylene oxide units in the polyether component, viscosity 240 cSt/25° C., MW about 6500 | 0.2 | 0.2 | 0.2 | 0.2 |
| ® Hostaperm Blue B2G (C.I. 74 160) | 9.7 | | | |
| Permanent Red FBB (C.I. 12 485) | | 12.9 | | |
| Permanent Yellow GR (C.I. 21 100) | | | 8.6 | |
| Carbon black (® Printex 25) | | | | 13.6 |
| Tetrahydrofuran | 398.6 | 363.9 | 382.4 | 378.8 |
| 4-Hydroxy-4-methyl-2-pentanone | 113.9 | 121.3 | 124.3 | 123.1 |
| 1-Methoxy-2-propanol | 360.6 | 326.5 | 353.7 | 331.5 |
| γ-Butyrolactone | 75.9 | 121.3 | 86.0 | 113.6 |

The pigments were dispersed together with some of the binder and some of the butyrolactone. The mean particle size was below 200 nm.

The coated films were dried in a drying tunnel at temperatures of up to 110° C. The layer weight was between 0.6 and 0.8 g/m².

The following adhesive-layer solution was applied to the dry photopolymerizable layer:

| Vinyl acetate-crotonic acid copolymer 95:5 | 50.0 parts by weight |
|---|---|
| Pyrogenic silicic acid (mean particle size 40 nm) | 0.16 part by weight |
| Water | 252 parts by weight |
| Ethanol | 24.0 parts by weight |
| Ammonia water, 25% | 5.0 parts by weight |

The coated films were dried in a drying tunnel at temperatures of 100° C. The layer weight was 6.5 g/m².

This material was used to produce positive and negative colour proofs simultaneously on a receiving material using the following process:

A material as described above coloured in a primary colour was laminated, by means of the adhesive layer which was applied to the photopolymerizable layer, onto the image-receiving material, the film support was peeled off, the area where the positive colour proof was to be formed was covered with a light-opaque film, the area where the negative colour proof was to be formed was exposed through the associated negative colour separation film, the film support which had previously been peeled off was laminated back onto the material, the area where the negative colour proof was to be formed was flood-exposed, and at the same time the area where the positive colour proof was to be formed was exposed through the positive colour separation film, and the image was developed by peeling-off the film support, removing the non-image areas. The steps were repeated using a material in each of the other three primary colours, until the 4-colour proof was complete.

Example 2

A material as described above coloured in a primary colour was laminated, by means of the adhesive layer which was applied to the photopolymerizable layer, onto the image-receiving material, the area where the negative colour proof was to be formed was covered with a light-opaque film, the area where the positive colour proof was to be formed was exposed through the associated positive colour separation film, the positive colour proof was developed by peeling-off the film support, removing the non-image areas of the positive image, the area where the negative colour proof was to be formed was exposed through the associated negative colour separation film with simultaneous flood-exposure of the positive image, the film support which had previously been peeled off was laminated back onto the material, a flood exposure was carried out, and the negative image was developed by peeling-off the film support, removing the non-image areas. The steps were repeated using a material in each of the other three primary colours, until the 4-colour proof was complete.

Example 3

Negative colour proofs were produced by the following process using the material described in Example 1:

A material as described above coloured in a primary colour was laminated, by means of the adhesive layer which was applied to the photopolymerizable layer, onto the image-receiving material, the film support was peeled off, the material was exposed through the associated negative colour separation film, the film support which had previously been peeled off was laminated back onto the material, a flood exposure of the entire image was carried out, and the image was developed by peeling-off the film support, removing the non-image areas. The steps were repeated using a material in each of the other three primary colours, until the 4-colour proof was complete.

Example 4

Positive colour proofs were produced by the following process using the material described in Example 1:

A material as described above coloured in a primary colour was laminated, by means of the adhesive layer which was applied to the photopolymerizable layer, onto the image-receiving material, the material was exposed through the associated positive colour separation film, and the image was developed by peeling-off the film support, removing the non-image areas. The steps were repeated using a material in each of the other three primary colours, until the 4-colour proof was complete.

We claim:

1. A process for the production of positive and negative colour proofs together on a receiving material comprising:
   laminating a material coloured in a primary colour onto an image-receiving material,
   peeling-off any film support, exposing the coloured material under an associated negative colour separation film, with the areas where positive colour proofs to be formed covered in a light-opaque manner, re-laminating the film support which had earlier been peeled off back onto the coloured material, flood-exposing the part on which the negative colour proofs are to be formed while simultaneously exposing the areas where positive colour proofs are to be formed under an associated positive colour separation film, developing the image by peeling-off the film support together with the non-image areas, and repeating the same steps using a material in at least one other primary colour, where the coloured material to be employed comprises A) a transparent, flexible film support made of plastic,
B) a photopolymerizable layer which comprises
   B1) a polymeric binder,
   B2) a free-radical-polymerizable compound,
   B3) a compound which is capable of initiating the polymerization of B2) on exposure to actinic light, and
   B4) a solid or coloured pigment in a primary colour of multicolour printing, and
C) a thermoplastic adhesive layer on the photopolymerizable layer.

2. A process for the production of positive and negative colour proofs together on a receiving material using a material comprising A) a transparent, flexible film support made of plastic,
B) a photopolymerizable layer which comprises
   B1) a polymeric binder,
   B2) a free-radical-polymerizable compound,
   B3) a compound which is capable of initiating the polymerization of B2) on exposure to actinic light, and
   B4) a solid or coloured pigment in a primary colour of multicolour printing, and
C) a thermoplastic adhesive layer on the photopolymerizable layer, said process comprising laminating a material coloured in a primary colour onto an image-receiving material, exposing the coloured material under an associated positive colour separation film, with areas where negative colour proofs are to be formed covered in a light-opaque manner, developing positive images by peeling-off a film support from the photopolymerizable layer together with the non-image areas of the positive images, exposing the areas where negative colour proofs are to be formed under an associated negative colour separation film while simultaneously flood-exposing the positive images, re-laminating the film support onto the material, flood-exposing the entire system, developing the negative images by peeling-off the film support from the photopolymerizable layer together with the non-image areas of the negative images, and optionally repeating the process using a material in at least one other primary colour.

3. A process for making both a positive image and a negative image wherein the same receiving material is employed for said positive image and said negative image.

4. A process as claimed in claim 3, wherein said material comprises

A) a transparent, flexible film support made of plastic,
B) a photopolymerizable layer which comprises
   B1) a polymeric binder,
   B2) a free-radical-polymerizable compound,
   B3) a compound which is capable of initiating the polymerization of B2) on exposure to actinic light, and
   B4) a solid or coloured pigment in a primary colour of multicolour printing, and
C) a thermoplastic adhesive layer on the photopolymerizable layer.

5. A process for the production of positive and negative colour proofs together on a receiving material comprising:

laminating a material coloured in a primary colour onto an image-receiving material, peeling-off any film support, exposing the material under an associated negative colour separation film with areas where positive colour proofs are to be formed covered in a light-opaque manner, re-laminating the film support which had earlier been peeled off back onto the material, flood-exposing areas on which the negative colour proofs are to be formed while simultaneously exposing the areas where positive colour proofs are to be formed under an associated positive colour separation film, developing image by peeling-off the film support together with non-image areas, and repeating the same steps using a material in at least one other primary colour.

6. A process for the production of positive and negative colour proofs together on a receiving material comprising laminating a material coloured in a primary colour onto an image-receiving material, exposing coloured material under an associated positive colour separation film with areas where negative colour proofs are to be formed are covered in a light-opaque manner, developing positive images by peeling-off a film support from the photopolymerizable layer together with the non-image areas of the positive images, exposing areas where negative colour proofs are to be formed under an associated negative colour separation film while simultaneously flood-exposing the positive images, re-laminating the film support onto the material, flood-exposing entire system, developing negative images by peeling-off the film support from the photopolymerizable layer together with the non-image areas of the negative images, and optionally repeating the process using a material in at least one other primary colour.

* * * * *